(12) United States Patent
Yang et al.

(10) Patent No.: US 10,535,412 B2
(45) Date of Patent: Jan. 14, 2020

(54) SINGLE PULSE VERIFICATION OF MEMORY CELLS

(71) Applicant: SanDisk Technologies LLC, Plano, TX (US)

(72) Inventors: Xiang Yang, Santa Clara, CA (US); Huai-Yuan Tseng, San Ramon, CA (US); Deepanshu Dutta, Fremont, CA (US); Jianzhi Wu, Milpitas, CA (US); Gerrit Jan Hemink, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/963,647

(22) Filed: Apr. 26, 2018

(65) Prior Publication Data

US 2019/0252030 A1    Aug. 15, 2019

Related U.S. Application Data

(60) Provisional application No. 62/628,906, filed on Feb. 9, 2018.

(51) Int. Cl.
| | |
|---|---|
| *G11C 16/06* | (2006.01) |
| *G11C 16/34* | (2006.01) |
| *G11C 16/24* | (2006.01) |
| *G11C 16/26* | (2006.01) |
| *G11C 16/10* | (2006.01) |

(52) U.S. Cl.
CPC .......... *G11C 16/3459* (2013.01); *G11C 16/10* (2013.01); *G11C 16/24* (2013.01); *G11C 16/26* (2013.01)

(58) Field of Classification Search
CPC ..... G11C 16/3459; G11C 16/10; G11C 16/24; G11C 16/26
See application file for complete search history.

(56) References Cited

U.S. PATENT DOCUMENTS

| | | | |
|---|---|---|---|
| 5,532,962 A * | 7/1996 | Auclair | G06F 11/1008 365/184 |
| 5,587,951 A | 12/1996 | Jazayeri et al. | |
| 6,243,290 B1 * | 6/2001 | Kurata | G11C 11/5621 365/185.03 |
| 7,260,694 B2 | 8/2007 | Flautner et al. | |
| 7,408,807 B2 | 8/2008 | Roohparvar | |
| 7,468,926 B2 | 12/2008 | Shappir et al. | |

(Continued)

OTHER PUBLICATIONS

PCT Written Opinion for Application No. PCT/US2018/066815 dated Apr. 5, 2019.

(Continued)

*Primary Examiner* — Pho M Luu
(74) *Attorney, Agent, or Firm* — Foley & Lardner LLP

(57) ABSTRACT

A memory device includes memory cells coupled to a word line. The memory device includes a controller coupled to the word line. The controller is configured to program the memory cells coupled to the word line. The controller is configured to verify a programmed status of a first subset of the memory cells coupled to the word line and a programmed status of a second subset of the memory cells coupled to the word line, based on the programmed status of the first subset of the memory cells.

24 Claims, 10 Drawing Sheets

(56) References Cited

U.S. PATENT DOCUMENTS

| | | | |
|---|---|---|---|
| 8,085,600 B2* | 12/2011 | Kang | G11C 16/08 |
| | | | 365/185.22 |
| 8,422,292 B2 | 4/2013 | Choi et al. | |
| 9,236,139 B1 | 1/2016 | Lai et al. | |
| 9,478,280 B2* | 10/2016 | Yu | G11C 16/3459 |
| 2005/0195651 A1 | 9/2005 | Roohparvar | |
| 2006/0221661 A1 | 10/2006 | Hemink et al. | |
| 2007/0171725 A1 | 7/2007 | Chan | |
| 2011/0122692 A1 | 5/2011 | Dutta et al. | |
| 2012/0218818 A1 | 8/2012 | Han et al. | |
| 2015/0003156 A1 | 1/2015 | Berckmann et al. | |
| 2017/0062057 A1 | 3/2017 | Yang | |
| 2017/0162272 A1 | 6/2017 | Kavalipurapu et al. | |

OTHER PUBLICATIONS

PCT International Search Report for Application. No. PCT/US2018/066815 dated Apr. 5, 2019.

* cited by examiner

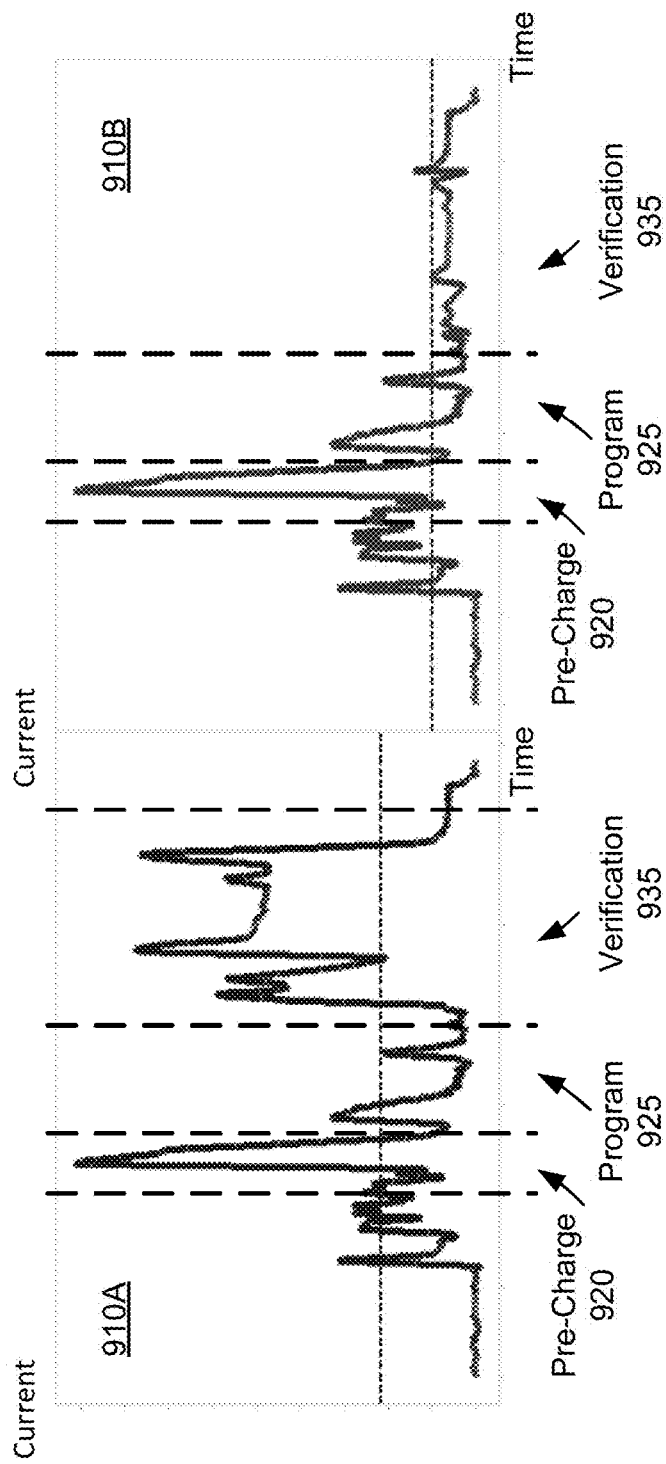

SINGLE PULSE VERIFICATION OF MEMORY CELLS

CROSS-REFERENCE TO RELATED APPLICATIONS

The present application claims priority to U.S. Provisional Application No. 62/628,906 filed on Feb. 9, 2018, which is incorporated by reference herein in its entirety.

BACKGROUND

The following description is provided to assist the understanding of the reader. None of the information provided or references cited is admitted to be prior art.

Semiconductor memory has become more popular for use in various electronic devices. Semiconductor memory may be implemented in cellular telephones, digital cameras, personal digital assistants, mobile computing devices, non-mobile computing devices and other devices. Operating a memory device includes performing different voltages through different phases. For example, a flash memory device is operated by applying different voltages to memory cells during a programming phase and a verification phase. Verifying programmed status may be employed to ensure memory cells are correctly programmed. However, testing programmed status in the memory cells in the verification phase may incur power consumption and delay that degrade the performance of the memory device.

BRIEF DESCRIPTION OF THE DRAWINGS

FIG. 9A illustrates a power consumption of storing data at memory cells, when programming operation is performed on entire memory cells.

FIG. 9B illustrates a power consumption of storing data at the memory cells, when programming operation is performed on a subset of the memory cells.

Figure 1:
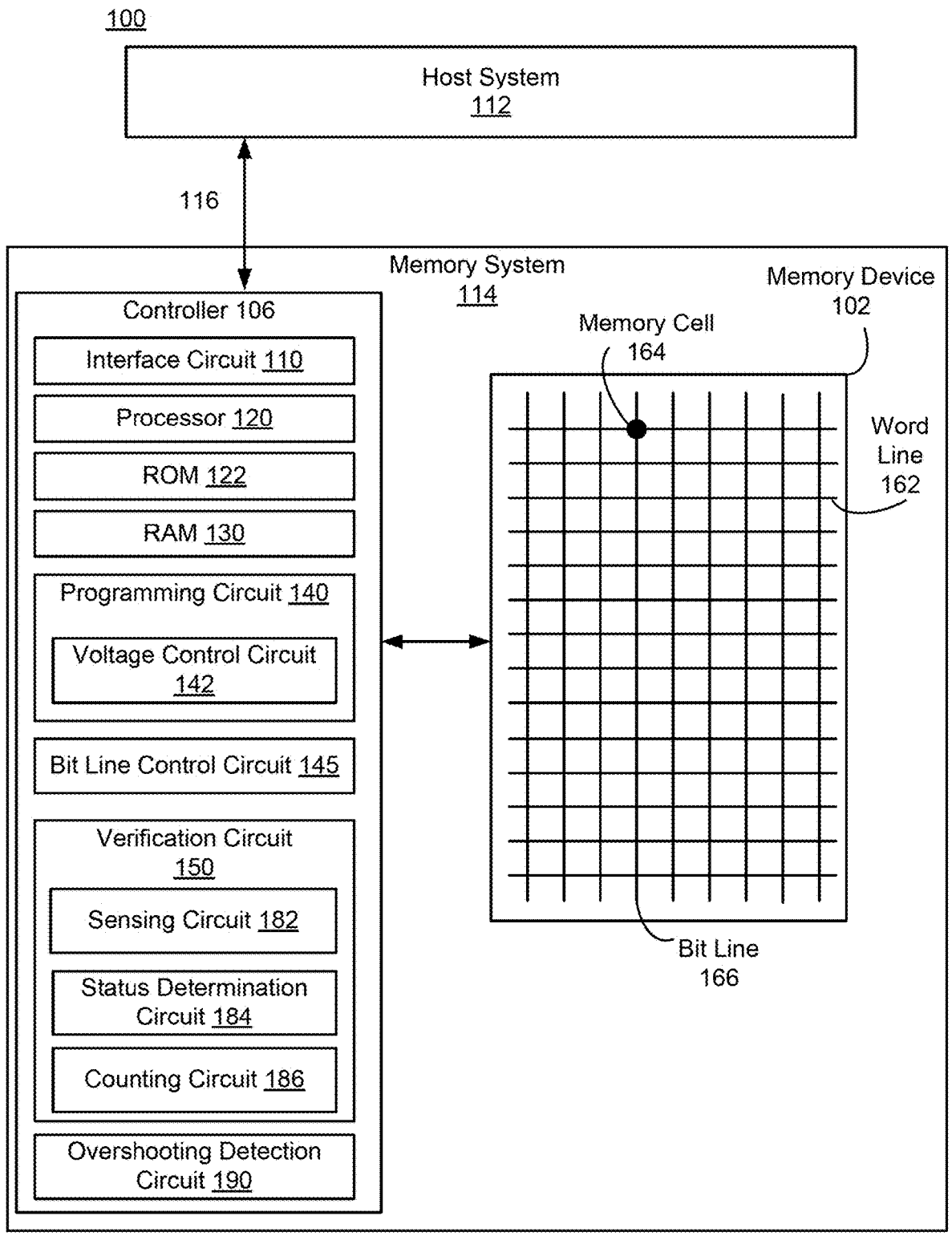
FIG. 1 is a block diagram of a computer system according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed herein are a method and a system for verifying programmed status of a plurality of memory cells by applying a single programming pulse to the plurality of memory cells and selectively verifying a subset of the plurality of memory cells. Verifying a programmed status (also referred to as "a programming status") of a memory cell herein refers to verifying whether a memory cell is programmed with an electrical representation within a predetermined range. Examples of an electrical representation include a threshold voltage, an electric charge amount stored, etc. of a memory cells. For example, if a memory cell is programmed with a threshold voltage within a predetermined range, then the memory cell may be determined to be programmed correctly. If a memory cell is programmed with a threshold voltage beyond the predetermined range, then the memory cell may be determined to be programmed incorrectly.

Rather than verifying whether each memory cell has been programmed correctly, only a subset of the memory cells that is least likely to be responsive to the single programming pulse is checked. The subset of memory cells includes less than all of the plurality of memory cells. A programmed status of the remaining memory cells of the plurality of memory cells may be inferred (or indirectly verified) based on the programmed status of the subset of the memory cells that is affirmatively checked. For example, if the memory cells that are least responsive to the single programming pulse are programmed correctly, then the other memory cells can be inferred (or indirectly verified) to be programmed correctly in response to the single programming pulse.

In one aspect, a verification operation is applied on a subset of memory cells coupled to a word line. A verification operation applied on a memory cell is an operation to verify a programmed status of the memory cell. Examples of such a verification operation include sensing current or voltage through the memory cell, and determining whether a threshold voltage programmed on the memory cell based on the sensed current or voltage is within a predetermined range. A threshold voltage programmed on a memory cell corresponds to a particular state. For example, in an example embodiment, a threshold voltage of a memory cell between ~2.5V-3.5V represents a state '0' and a threshold voltage between ~−1.5V-0.5V represents a state '1'. Whether the subset of the memory cells is correctly programmed or not can be verified by determining whether the threshold voltages of a subset of the memory cells are within a predetermined range.

In one aspect, programmed status of memory cells coupled to a word line is inferred (or indirectly verified) based on programmed status of a subset of the memory cells. The subset of the memory cells to apply a verification operation may be determined based on a characteristic of R-C loading of a pulse signal applied through a word line of the memory cells. In particular, a characteristic that a memory cell located farther away from a programming circuit generating the single programming pulse will have a lower threshold voltage programmed in response to the single programming pulse than a memory cell located closer to the programming circuit due to higher R-C loading is exploited. For example, a verification operation may be performed on a subset of memory cells coupled to a word line farthest away from the programming circuit, while the verification operation is not performed on remaining memory cells coupled to the word line (which are closer to programming circuit than the memory cells on which the verification operation is performed). If the subset of the memory cells farthest away is programmed correctly, then remaining subsets of the memory cells can be inferred (or indirectly verified) to be programmed correctly. In other embodiments, a verification operation may be performed on a subset of memory cells based on an indicator that the subset of memory cells is likely not as responsive to the single programming pulse as other memory cells on a given word line.

Advantageously, by performing verification operation on a subset of memory cells coupled to a word line rather than all memory cells coupled to the word line, power consumption for verifying programmed status of the memory cells can be reduced. Moreover, by performing verification operation on a subset of memory cells coupled to a word line, a speed of verifying the programmed status of the memory cells can be improved compared to performing verification operation on all memory cells coupled to the word line. The speed and power savings are realized at least in part because fewer memory cells are involved in the verification operation.

FIG. 1 is a block diagram of a computer system 100, according to an example embodiment. The computer system 100 includes a memory system 114 operating according to commands from a host system 112. The computer system 100 can be any electronic device such as a personal computer, a server computer, a laptop, a smart phone, a tablet computer, a smart watch, etc. The memory system 114 communicates with the host system 112 through a host interface 116. The memory system 114 may be in the form of a removable memory such as a memory card, or may be in the form of an embedded memory system.

The memory system 114 includes a memory device 102 and a controller 106. The controller 106 is a circuit that controls operations of the memory device 102, according to commands from the host system 112. The memory device 102 includes one or more arrays of non-volatile memory cells 164 distributed over one or more integrated circuit chips. The memory cells 164 may be logically partitioned into a plurality of subsets for performing a verification operation. Each subset may have a same number of memory cells 164 or a different number of memory cells 164. For example, a first subset may have only a single memory cell 164, and a second subset may have multiple memory cells 164. In one implementation, the memory cells 164 may be logically partitioned into eight subsets. In other embodiments, the memory cells 164 may be partitioned into any number of subsets.

The memory device 102 is a hardware component that stores electronic data. In one aspect, the memory device 102 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory device 102 can be formed from passive and/or active elements, in any combinations and may include a plurality of memory cells. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. In a non-limiting example, flash memory devices in a NAND configuration (NAND memory) may include memory elements connected in series. The NAND memory array may be configured so that the array includes one or more memory strings in which a string includes multiple memory elements that share a single bit line. Alternatively, memory elements may be configured so that each element is individually accessible, e.g., a NOR memory array. NAND and NOR memory configurations are exemplary, and memory elements may be configured otherwise.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry may be implemented for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but covers all relevant memory structures within the spirit and scope as described herein.

In some embodiments, the memory device 102 includes word lines 162 and bit lines 166 and sense lines (not shown for simplicity). Word lines 162 may be elongated in one direction (e.g., horizontal direction) and bit lines 166 may be elongated in another direction (e.g., vertical direction). Sense lines may be elongated along the word lines, along the bit lines 166, or along a direction that traverses the directions of the word lines 162 and the bit lines 166. Memory cells 164 may be disposed where corresponding bit lines 166, word lines 162, and sense lines overlap. By applying voltages or currents through a bit line 166 and a word line 162, a corresponding memory cell can be programmed. Moreover, by applying a voltage at the bit line 166, the memory cell 164 may conduct current through a sense line depending on a programmed state of the memory cell.

The controller 106 controls operations of the memory device 102. In one embodiment, the controller 106 includes an interface circuit 110, a processor 120, read-only-memory (ROM) 122, random access memory (RAM) 130, a programming circuit 140, a bit line control circuit 145, a verification circuit 150, and an overshooting detection circuit 190. These components may be embodied as an application specific integrated circuit, field programmable gate array, other controller embodiments known to those of ordinary skill in the art, or a combination of one or more of these implementations.

The programming circuit 140 is a circuit coupled to memory cells 164 through word lines 162 that programs memory cells 164. The programming circuit 140 may also be considered a means for programming memory cells 164 coupled to a word line 162. The programming circuit 140 applies a programming pulse to a word line 162 to program a memory cell coupled to the word line. In response to the programming pulse, characteristic (e.g., threshold voltage or storage charge) of a memory cell may change. The programming circuit 140 includes a voltage control circuit 142 that adjusts a voltage of the programming pulse applied to the word line 162.

The bit line control circuit 145 is a circuit coupled to bit lines 166 of the memory cells 164 through bit lines 166. When the programming circuit 140 applies the single programming pulse, the bit line control circuit 145 may apply certain voltages to bit lines 166 that allow programming of memory cells. The bit line control circuit 145 may also apply a bit line voltage (e.g., VBL) to a subset of memory cells, when verifying one or more subsets of memory cells. A bit line voltage (e.g., VBL) is a voltage that allows the one or more subset of the memory cells to conduct current depending on programmed status.

The verification circuit 150 is a circuit that verifies a status of one or more memory cells. In one aspect, the status of the one or more memory cells is a programmed or programming status. In other aspects, the status of the one or more memory cells may be any programming relevant state or condition of the one or more memory cells. Verifying the status may include checking, testing, sensing, and/or determining the status of the memory cells. In an aspect, the verification circuit 150 directly senses a characteristic of a memory cell coupled to a word line, and indirectly verifies programmed status of another memory cells coupled to the word line. A characteristic of a memory cell may be an indication of a programmed status or other characteristic of a memory cell. Examples of such a characteristic include a threshold voltage programmed, a current flow through the memory cells, etc. Sensing characteristics of memory cells may include checking, testing, determining, and/or verifying characteristics of the memory cells.

In one embodiment, the verification circuit 150 is coupled to memory cells 164 through sense lines. In this embodiment, the verification circuit 150 may be considered a means for selecting a first subset of the memory cells based on a physical location of the first subset of the memory cells. In other embodiments, the verification circuit 150 may be coupled to only the first subset of the memory cells, but not to the second subset of the memory cells. In this embodiment, selecting between the first subset and the second subset of memory cells for performing the verification operation may be omitted.

In one embodiment, the verification circuit 150 includes a sensing circuit 182, a status determination circuit 184, and a counting circuit 186. The sensing circuit 182 is a circuit that directly senses a characteristic of a subset of memory cells. The sensing circuit 182 may be a threshold voltage detection circuit that detects threshold voltages of the subset of the memory cells. The status determination circuit 184 is a circuit coupled to the sensing circuit 182 (or the threshold voltage detection circuit) that verifies programmed status of the memory cells based on characteristic of the subset of the memory cells. In one aspect, the status determination circuit 184 is a means for verifying a programmed status of the first subset of the memory cells to indirectly verify a programmed status of a second subset of the memory cells without directly verifying the programmed status of the second subset of the memory cells.

In one configuration, after programming of the memory cells, the sensing circuit 182 directly senses currents through sense lines of the first subset of the memory cells to confirm whether programmed characteristics of the first subset of the memory cells satisfy a target characteristic. For example, the threshold voltage detection circuit as the sensing circuit 182 detects threshold voltages of the first subset of the memory cells. Based on the sensed threshold voltages, the counting circuit 186 may determine a number of memory cells of the first subset of memory cells coupled to the word line having threshold voltages less than a target threshold voltage. The programmed status of the first subset of memory cells may be determined based on this number of memory cells. The status determination circuit 184 may further infer (or indirectly verify) the programmed status of the second subset of memory cells based on the determined programmed status of the first plurality of memory cells without directly sensing currents or threshold voltages of the second subset of the memory cells.

The overshooting detection circuit 190 is a circuit that performs an overshooting detection on a subset of the memory cells in a similar manner for performing verification operation on a different subset of the memory cells. An overshooting detection of a memory cell is a detection of an excessive voltage applied to the memory cell over an allowable range of voltage. A memory cell is designed to be programmed with an allowable range of voltage. When an excessive voltage over the allowable range is applied to the memory cell, then the memory cell may be damaged. By performing overshooting detection and lowering a voltage of the programming pulse applied, memory cells can be prevented from being damaged. In some implementation, the overshooting detection circuit 190 may share components with the verification circuit 150 or include identical components of the verification circuit 150. For example, the overshooting detection circuit 190 may share the sensing circuit 182 and the counting circuit 186 or implement components similar to the sensing circuit 182 and the counting circuit 186.

Detailed descriptions on operations of the programming circuit 140, the bit line control circuit 145, the verification circuit 150, and the overshooting detection circuit 190 are provided below with respect to FIG. 2 through 11.

Figure 2:
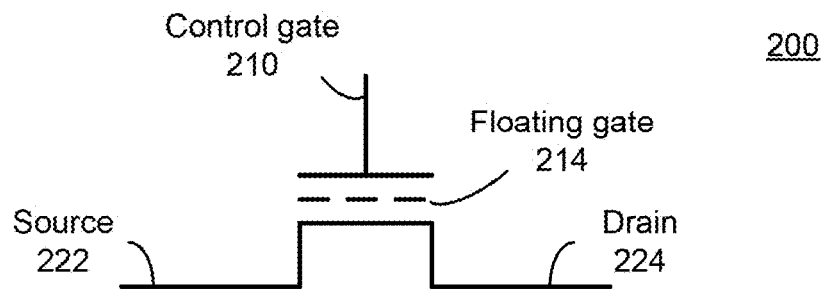
FIG. 2 is a circuit representation of a memory cell of the memory system according to an example embodiment.

FIG. 2 is a circuit representation of a memory cell 200 of the memory system 114. The memory cell 200 can be implemented by a field-effect transistor having a floating gate 214 or a charge trapping (dielectric) layer. The memory cell 200 also includes a source terminal 222, a drain terminal 224, and a control gate terminal 210.

Programming a memory cell 200 may be performed by storing charges at the floating gate 214. In one approach, a hot electron injection technique is used to program the memory cell 200. Hot electron injection results from an accelerating potential built up in the substrate. When an electron having an energy greater than the energy barrier (e.g., 3.1 eV for silicon), the electron passes into the floating gate 214. One method to provide hot electron injection is by having a forward-biased PN junction in the well. Electron injection can be achieved by applying, for example, a voltage which is greater than the energy barrier (e.g., 3.1 eV). The electric field accelerates the electrons to a sufficient energy to reach the floating gate 214 of the memory cell. According to the charges stored by the floating gate 214, a threshold voltage of the memory cell 200 may change.

Reading a state of a memory cell 200 may be performed by sensing the conduction current across the source terminal 222 and drain terminal 224 when a particular voltage is applied to the control gate terminal 210. In one configuration, the control gate terminal 210 is coupled to a word line 162, a drain terminal 224 is coupled to a bit line 166, and a source terminal 222 is coupled to a sense line. The memory cell 200 may conduct current by turning on the memory cell 200. Turning on the memory cell 200 may include applying a voltage to a gate terminal of the memory cell 200. According to a threshold of the memory cell 200, or charges on the floating gate 214, a corresponding conduction current with respect to a fixed reference control gate voltage may be detected. Similarly, the range of charge programmable onto the floating gate 214 defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (e.g., a cell-read reference current). In one implementation the detection of the conduction current relative to a threshold current is accomplished by examining the rate of the conduction current discharging through the capacitance of the bit line.

Figure 3:
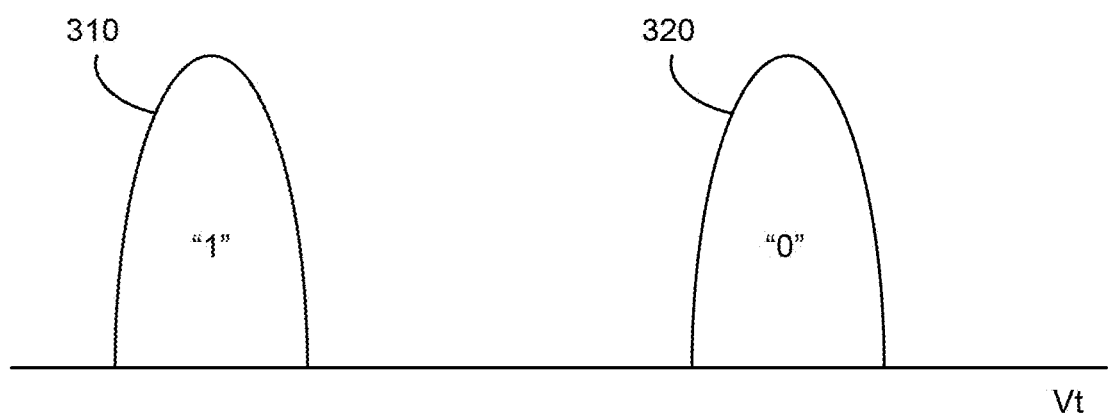
FIG. 3 is a plot illustrating a distribution of threshold voltages programmed on memory cells, according to an example embodiment.

FIG. 3 illustrates a distribution of threshold voltages programmed on memory cells, according to an example embodiment. For a single level cell programming, each memory cell may be programmed in either '0' state or '1' state. In one approach, a memory cell programmed with a threshold voltage within a first range (e.g., 2.5V~4.5V) is considered to be programmed with '0' state, and a memory cell programmed with a threshold voltage within a second range (e.g., −1.5V~0.5V) is considered to be programmed with '1' state. Thus, memory cells programmed in single level cell programming have threshold voltage distributions 310 and 320 as shown in FIG. 3.

In one aspect, if the distribution 320 shifts towards the distribution 310, then the memory cells may be determined to be programmed incorrectly. Conversely, if the distribution 320 shifts away from distribution 310, then the memory cells may be determined to be programmed correctly.

Figure 4:
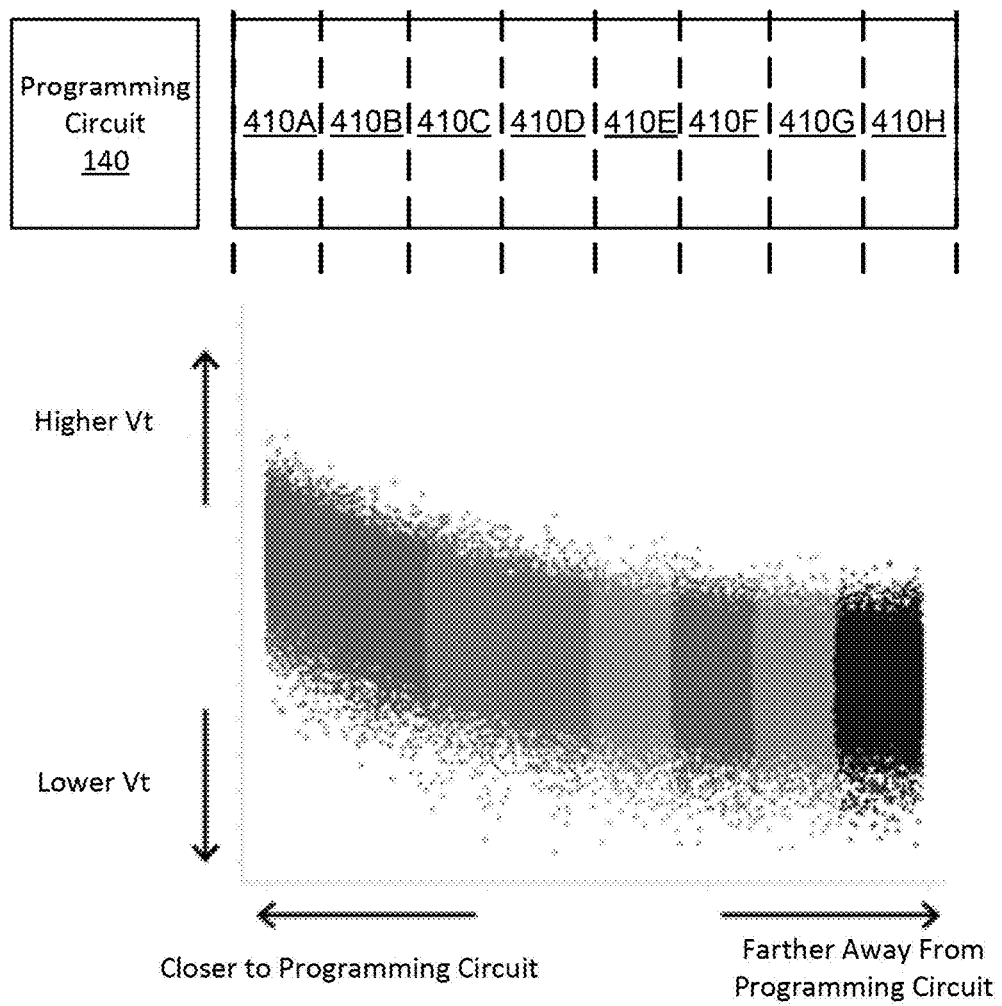
FIG. 4 is a plot illustrating a threshold voltage distribution, according to an example embodiment.
Figure 5:
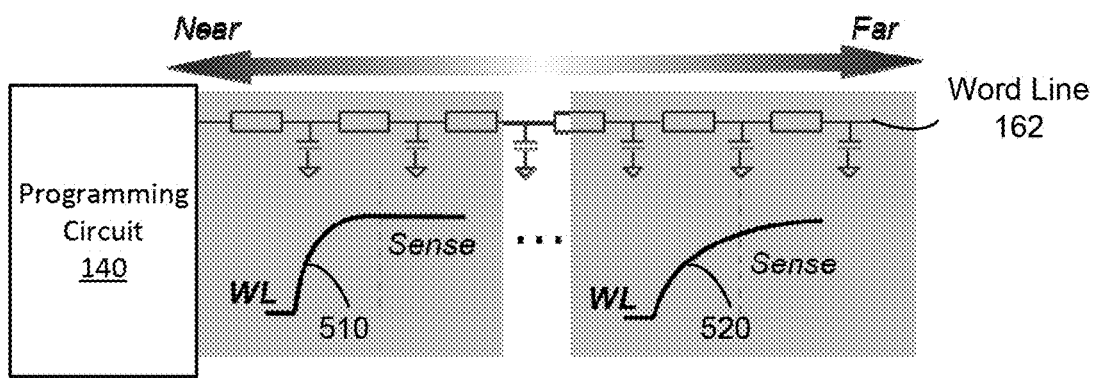
FIG. 5 is an equivalent circuit diagram illustrating an R-C loading applied to different memory cells according to locations of the memory cells with respect to a programming circuit, according to an example embodiment.

FIG. 4 is a plot illustrating a threshold voltage distribution, according to an example embodiment. FIG. 5 is an equivalent circuit diagram illustrating R-C loading on different memory cells according to locations of the memory cells with respect to a programming circuit 140, according to an example embodiment. In the example shown in FIGS. 4 and 5, the programming circuit 140 (e.g., controller 106) may be located on a first (e.g., left) side of the various memory cells. The programming circuit 140 may apply a programming pulse to the various memory cells 410A, 410B ... 410H through a word line 162 and perform a verification operation on a subset of the memory cells (e.g., 410H) to determine if the memory cells 410A, 410B ... 410H are programmed correctly. The verification operation determines if a threshold voltage of the subset of memory cells (e.g., 410H) has appropriately changed to meet or exceed a target threshold voltage according to the programming pulse. In one aspect, a programming pulse 520 propagated to a memory cell (e.g., 410H) farther away from the programming circuit 140 may suffer from a higher R-C loading compared to a programming pulse 510 propagated to a memory cell (e.g., 410A) closer to the programming circuit 140. Hence, when the programming circuit 140 applies a pulse to a word line 162, memory cells (e.g., 410A) closer to the programming circuit 140 may receive the pulse faster than memory cell (e.g., 410H) farther away from the programming circuit 140 due to additional R-C loading. Accordingly, the memory cells that are farther away from the programming circuit 140 may have a lower likelihood of successfully transitioning their threshold voltage according to the programming pulse than memory cells closer to the programming circuit 140. For example, assuming that the memory cells coupled to the single word line 162 are divided into eight subsets, a subset of memory cells 410A will exhibit more change in threshold voltage due to the programming pulse than other subsets of memory cells 410B, 410C ... 410H. In another aspect, a subset of memory cells 410H will exhibit less change in threshold voltage due to the programming pulse than each of the other subsets of memory cells 410A, 410B ... 410G. Although the memory cells coupled to a word line are divided into eight subsets in FIG. 4, the memory cells coupled to the word line may be divided into any number.

In one embodiment, verification operation is performed on only a subset of the memory cells (e.g., 410H) based on a location of the memory cells with respect to the programming circuit 140 to verify programmed status of the memory cells 410A, 410B ... 410H. In one approach, the success of programming the memory cells 410A, 410B ... 410H coupled to a word line 162 is determined by performing a verification operation on a subset of the memory cells 410H that are located farthest away from the programming circuit 140. In particular, the subset of memory cells 410H farthest away from the programming circuit 140 exhibits a smallest magnitude of change of threshold voltage in response to a programming pulse 510 from the programming circuit 140, because the programming pulse 520 propagated to the memory cells 410H suffers from R-C loading. Thus, if a threshold voltage of a subset of memory cells 410H is determined to be higher than a reference voltage (e.g., target threshold voltage), than threshold voltages of other subsets of memory cells 410A, 410B ... 410G are likely be higher than the reference voltage. Hence, a successful programmed status for the subset of memory cells 410H coupled to the word line 162 is indicative of a successful programmed status for a remainder of the memory cells 410A, 410B ... 410G coupled to the word line 162.

The verification circuit 150 may perform a verification operation on the subset of the memory cells 410H by sensing currents or voltages through the subset of the memory cells 410H, and determining threshold voltages programmed on the subset of the memory cells 410H based on the sensed currents or voltages. The bit line control circuit 145 may apply a bit line voltage (e.g., VBL) to bit lines of a subset of the memory cells 410H, while the verification circuit 150 performs the verification operation. The bit line voltage (e.g., VBL) may allow the subset of the memory cells to conduct depending on threshold voltages programmed. When sensing current through the subset of the memory cells 410H, a predetermined voltage (e.g., '0' voltage) may be applied to bit lines 166 of other subsets of the memory cells 410A, 410B ... 410G. If at least a predetermined number of the subset of the memory cells 410H has threshold voltages that satisfy (e.g., equal or exceed) a reference voltage, then the verification circuit 150 may determine that programming on the memory cells 410A, 410B ... 410H was successful. The predetermined number may be determined to be a certain percentage (e.g., 0.1%) of the number of the subset of the memory cells. From the subset of the memory cells 410H, if a number of memory cells programmed with threshold voltages that satisfy a reference voltage is less than the predetermined number, then the verification circuit 150 may determine that the memory cells 410A, 410B ... 410H are not programmed successfully. If the memory cells 410 coupled to a word line 162 are not programmed correctly, the voltage control circuit 142 may increase a voltage of a subsequent programming pulse, and the programming circuit 140 may reprogram the memory cells 410 coupled to the word line 162 with the subsequent programming pulse having increased voltage.

In one embodiment, the overshooting detection circuit 190 performs overshooting detection on a subset of the memory cells coupled to a word line 162 rather than all memory cells coupled to the word line 162. Such an embodiment exploits the damping of the single programming pulse propagated through the word due to R-C loading. For example, the subset of memory cells 410A may receive a higher voltage of the programming pulse than the subset of memory cells 410H, because the subset of memory cells 410A suffers less R-C loading as compared to the other subsets of memory cells 410B-410H. Hence, if the subset of memory cells 410A is not influenced by the overshooting of the single programming pulse from the programming circuit 140, then the subset of memory cells 410H will not be influenced by the overshooting of the single programming pulse from the programming circuit 140. The overshooting detection circuit 190 may perform overshooting detection on a subset of the memory cells closest to the programming circuit 140. Alternatively, the overshooting detection circuit 190 may perform an overshooting detection on a subset of the memory cells associated with an indicator indicating that the subset of the memory cells may likely be damaged or influenced by an overshooting of a single programming pulse.

The overshooting detection circuit 190 may perform overshooting detection on the subset of the memory cells 410A by sensing currents or voltages through the subset of the memory cells 410A, and determining threshold voltages programmed on the subset of the memory cells 410A based on the sensed currents or voltages. The bit line control circuit 145 may apply a bit line voltage (e.g., VBL) or modified bit line voltage (e.g., ½ VBL) to bit lines 166 of a subset of the memory cells 410H, while the overshooting detection circuit 190 performs overshooting detection. The bit line voltage (e.g., VBL) or the modified bit line voltage (e.g., ½ VBL) may allow the subset of the memory cells to conduct, depending on threshold voltages programmed. When sensing current through the subset of the memory cells 410A, a predetermined voltage (e.g., '0' voltage) may be applied to bit lines of other subsets of the memory cells 410B, 410C . . . 410H. From the subset of memory cells 410A, if a number memory cells programmed with threshold voltages over a reference voltage is less than a predetermined number, then the overshooting detection circuit 190 may determine that the pulse applied by the programming circuit 140 has no overshooting. If at least a predetermined number of the subset of the memory cells 410A has threshold voltages over the reference voltage, then the overshooting detection circuit 190 may determine that the pulse applied by the programming circuit 140 has overshooting. If the programming pulse applied by the programming circuit 140 has overshooting, the voltage control circuit 142 may decrease a voltage of the subsequent programming pulse, and the programming circuit 140 may reprogram the memory cells 410 coupled to the word line 162 with the subsequent programming pulse having decreased voltage.

Figure 6A:
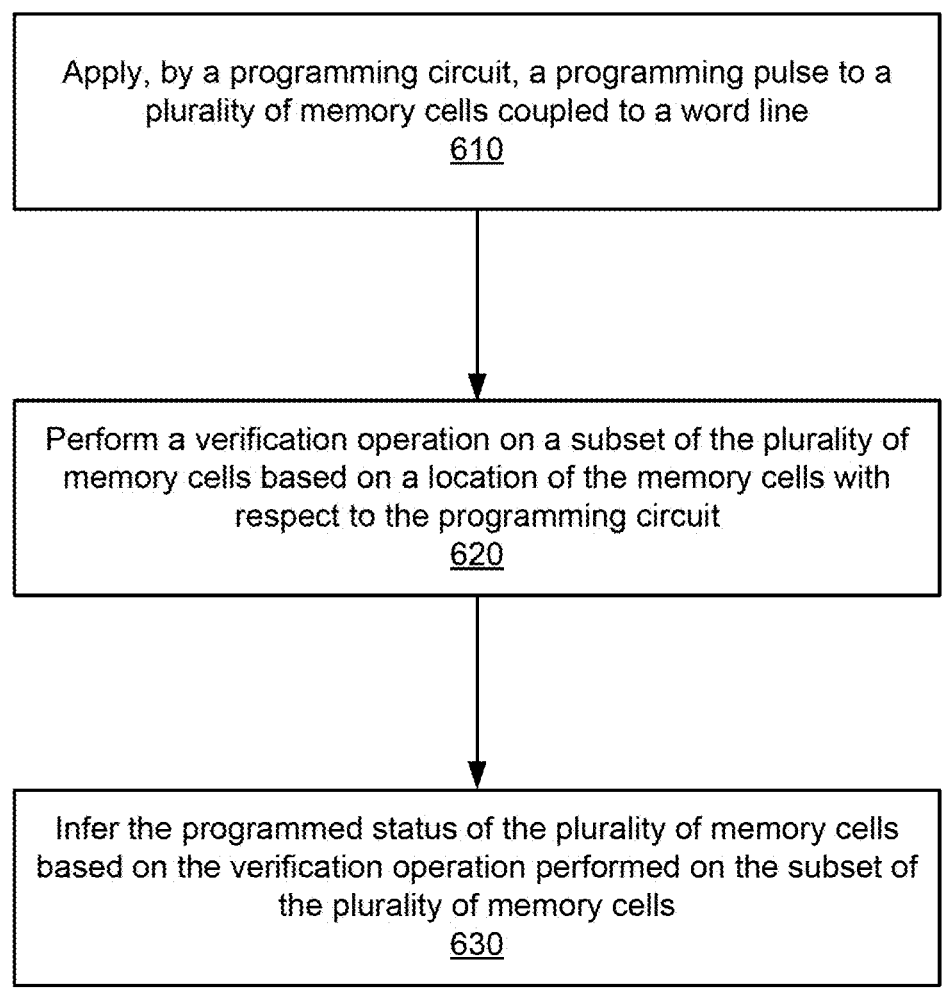
FIG. 6A is a flow chart illustrating a process of verifying programmed status of memory cells based on a single pulse applied to the memory cells, according to an example embodiment.

Referring to FIG. 6A, illustrated is a flow chart of an example process 600A for verifying a programmed status of memory cells based on a pulse applied to the memory cells. The process 600 may be performed by the controller 106 of FIG. 1. In other embodiments, the process 600 may be performed by other entities. In other embodiments, the process 600 includes more, fewer, or different operations than shown in FIG. 6A.

In an operation 610, the programming circuit 140 applies a single programming pulse to a plurality of memory cells coupled to a word line 162 to program the memory cells.

The verification circuit 150 performs a verification operation on a subset of the memory cells based on a location of the memory cells with respect to the programming circuit 140 in an operation 620. The verification operation may be performed on the subset of the memory cells that are least likely responsive to the single programming pulse applied by the programming circuit 140. For example, the verification operation is performed on the subset of the memory cells farthest away from the programming circuit 140. In another example, the verification operation is performed on the subset of memory cells associated with an indicator. The indicator may indicate the memory cells that are least likely responsive to the single programming pulse. The indicator may be generated through testing characteristics of the memory cells prior to deployment of the memory cells or generated based on location of the subset of the memory cells with respect to the programming circuit 140. The sensing circuit 182 may sense threshold voltages programmed on the subset of the memory cells, and determine whether the subset of the memory cells is programmed correctly or not based on the sensed threshold voltages.

In an operation 630, the verification circuit 150 may infer (or indirectly verify) a programmed status of all memory cells coupled to the word line 162 based on the programmed status of the subset of the memory cells determined in operation 620. For example, if the status determination circuit 184 determines that the subset of the memory cells farthest away from the word line 162 is programmed correctly, then the status determination circuit 184 may infer (or indirectly verify) that the memory cells coupled to the word line 162 are programmed correctly. If the status determination circuit 184 determines that the subset of the memory cells farthest away from the word line 162 is programmed incorrectly, then the status determination circuit 184 may infer (or indirectly verify) that the memory cells coupled to the word line 162 are programmed incorrectly.

If the memory cells coupled to the word line 162 are determined to be programmed incorrectly, then the programming circuit 140 may reprogram the memory cells coupled to the word line with a programming pulse having a higher voltage. If the memory cells coupled to the word line 162 are determined to be programmed correctly, then reprogramming of the memory cells coupled to the word line 162 may be omitted.

In some embodiments, the operation 630 may be omitted. For example, after determining that the subset of the memory cells is determined to be programmed incorrectly, then the memory cells coupled to the word line 162 may be reprogrammed with a programming pulse having a higher voltage. If the subset of the memory cells coupled to the word line 162 are determined to be programmed correctly, then reprogramming of the memory cells coupled to the word line 162 may not be performed.

Figure 6B:
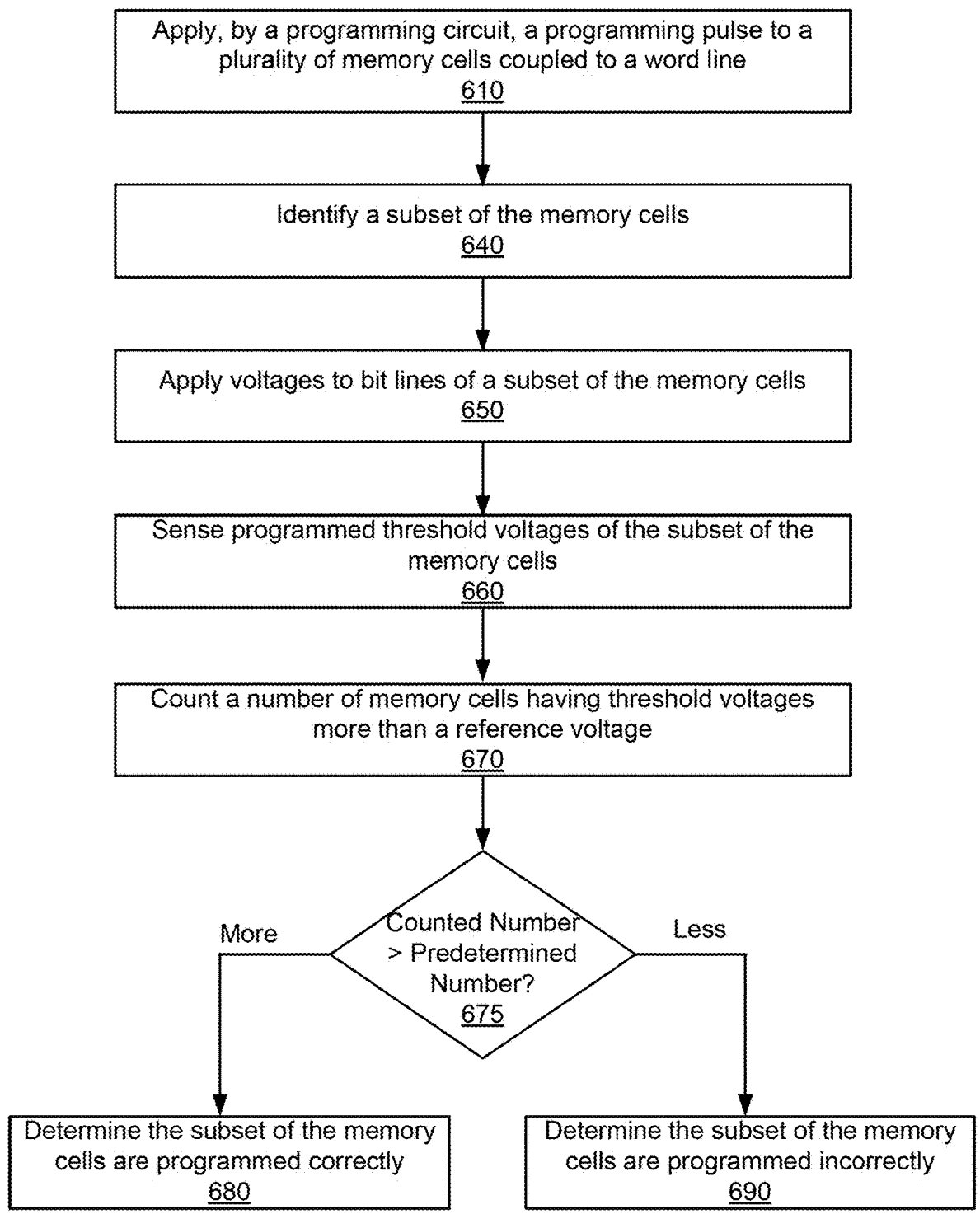
FIG. 6B is a flow chart illustrating a process of verifying programmed status of memory cells based on a single pulse applied to the memory cells, according to another example embodiment.

Referring to FIG. 6B, shown is a flow chart illustrating a process 600B for verifying programmed status of memory cells based on a single pulse applied to the memory cells, according to an example embodiment. The process 600B may be performed by the controller 106 of FIG. 1. In other embodiments, the process 600B may be performed by other entities. In other embodiments, the process 600B includes more, fewer, or different operations than shown in FIG. 6B.

In an operation 610, the programming circuit 140 applies a single programming pulse to a plurality of memory cells coupled to a word line 162 to program the plurality of memory cells.

The verification circuit 150 identifies a subset of the memory cells to perform a verification operation in an operation 640. The verification circuit 150 identifies the subset of the memory cells that is least likely to be affected by the single programming pulse. The verification circuit 150 may identify the subset of the memory cells based on a location of the subset of the memory cells or an indicator indicating that the subset of the memory cells is likely to be affected by the single programming pulse. Such indicator may be generated based on testing characteristics of the memory cells or generated based on the location of the subset of the memory cells with respect to the programming circuit 140.

The bit line control circuit 145 applies bit line voltages (e.g., VBL) to bit lines 166 of a subset of the memory cells in an operation 650. The bit line voltages (e.g., VBL) may allow the subset of the memory cells to conduct based on the programmed threshold voltages. The bit line control circuit 145 may apply ground voltage (e.g., '0' V) to bit lines 166 of other memory cells, such that the other memory cells do not conduct.

The sensing circuit 182 senses programmed threshold voltages of the subset of the memory cells in operation 660. The sensing circuit 182 may sense currents or voltages from the subset of the memory cells, in response to the bit line voltages (e.g., VBL) applied to the bit lines 166 of the subset of the memory cells, and determine threshold voltages according to the sensed currents or voltages.

The counting circuit 186 counts a number of memory cells, from the subset of the memory cells, having threshold voltages higher than a reference voltage in operation 670. The reference voltage is a target threshold voltage of correctly programmed memory cells. In one aspect, the reference voltage is indicative of a target distribution of threshold voltages. Referring to FIG. 3, for example, the distribution 320 may be a target distribution of threshold voltages of memory cells programmed with state '0'. However, a distribution of threshold voltages programmed on a subset of memory cells may shift towards the distribution 310 due to R-C loading. A reference voltage may correspond to a particular percentage (e.g., 0.1%) of the target distribution (e.g., 320) of threshold voltages. The status determination circuit 184 may compare the counted number of memory cells with a predetermined number corresponding to the particular percentage of the target distribution of threshold voltages in operation 675 to determine how the distribution of threshold voltages deviates from the target distribution of threshold voltages.

If the counted number is larger than the predetermined number, then the status determination circuit 184 determines that the subset of the memory cells is programmed correctly in operation 680, because the distribution of threshold voltages programmed on the subset of the memory cells would be farther away from the distribution 310 than a target distribution (e.g., 320) of threshold voltages.

If the counted number is less than the predetermined number, then the status determination circuit 184 determines that the subset of the memory cells is programmed incorrectly in operation 690, because the distribution of threshold voltages programmed on the subset of the memory cells would be shifted towards the distribution 310 from the target distribution (e.g., 320) of threshold voltages.

After determining whether the subset of the memory cells is programmed correctly or not, the controller 106 may proceed as described above with respect to FIG. 6A. For example, the status determination circuit 184 may infer (or indirectly verify) programmed status of the memory cells coupled to the word line 162 based on the programmed status of the subset of the memory cells. For another example, the controller 106 may omit the step of inferring the programmed status of the memory cells coupled to the word line 162, and reprogram the memory cells coupled to the word line 162 in response to the subset of the memory cells being programmed incorrectly.

In other embodiments, the counting circuit 186 may count a number of memory cells having threshold voltages less than a reference voltage in operation 670. In this embodiment, if the counted number is less than the predetermined number, then the status determination circuit 184 determines that the subset of the memory cells is programmed correctly in operation 680, because the distribution of threshold voltages programmed on the subset of the memory cells would be farther away from the distribution 310 than a target distribution (e.g., 320) of threshold voltages. In this embodiment, if the counted number is larger than the predetermined number, then the status determination circuit 184 determines that the subset of the memory cells is programmed incorrectly in operation 690, because the distribution of threshold voltages programmed on the subset of the memory cells would be shifted towards the distribution 310 from the target distribution (e.g., 320) of threshold voltages.

Figure 7B:
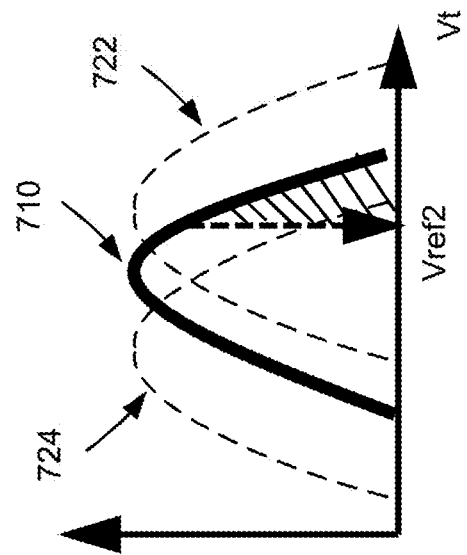
FIGS. 7A and 7B illustrate different approaches of verifying programmed status of memory cells based on a distribution of threshold voltages, according to an example embodiment.
Figure 7A:
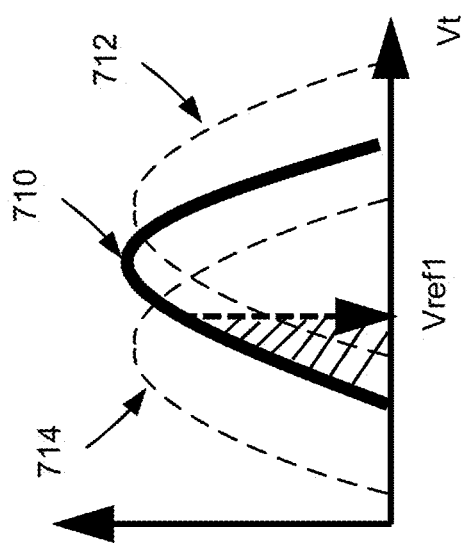

Referring to FIGS. 7A and 7B, illustrated are different approaches of verifying programmed status of memory cells based on a distribution of threshold voltages, according to an example embodiment. The verification circuit 150 may determine whether a subset of memory cells is programmed correctly or not by counting a number of memory cells, from the subset of the memory cells, having threshold voltages less than a reference voltage Vref1, as shown in FIG. 7A. Alternatively, the verification circuit 150 may determine whether a subset of memory cells is programmed correctly or not by counting a number of memory cells, from the subset of the memory cells, having threshold voltages larger than a reference voltage Vref2, as shown in FIG. 7B.

Referring to FIG. 7A, a target distribution 710 of threshold voltages may have a bell curve distribution. A reference voltage Vref1 may correspond to a particular percentage (e.g., 0.1%) of the target distribution 710. The verification circuit 150 may count a number of memory cells having threshold voltages less than the reference voltage Vref1. If the counted number is less than a predetermined number corresponding to a certain percentage (e.g., 0.1%) of the target distribution 710, then the verification circuit 150 determines that the subset of the memory cells is correctly programmed, because threshold voltages of the subset of the memory cells have a distribution 712 with higher threshold voltages. If the counted number is larger than the predetermined number corresponding to a certain percentage (e.g., 0.1%) of the target distribution 710, then the verification circuit 150 determines that the subset of the memory cells is incorrectly programmed, because the threshold voltages of the subset of the memory cells have a distribution 714 with lower threshold voltages.

Referring to FIG. 7B, a reference voltage Vref2 may correspond to a particular percentage (e.g., 1%) of the target distribution 710. The verification circuit 150 may count a number of memory cells having threshold voltages higher than the reference voltage Vref2. If the counted number is larger than a predetermined number corresponding to a certain percentage (e.g., 1%) of the target distribution 710, then the verification circuit 150 determines that the subset of the memory cells is correctly programmed, because threshold voltages of the subset of the memory cells have a distribution 722 with higher threshold voltages. If the counted number is less than the predetermined number corresponding to a certain percentage (e.g., 1%) of the target distribution 710, then the verification circuit 150 determines that the subset of the memory cells is incorrectly programmed, because the threshold voltages of the subset of the memory cells have a distribution 724 with lower threshold voltages.

Figure 8A:
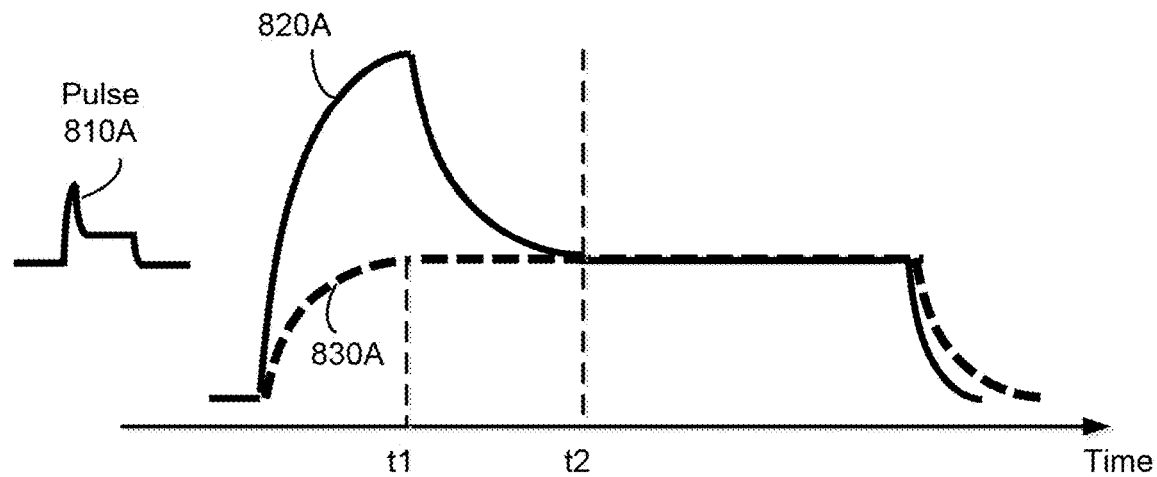
FIGS. 8A through 8C illustrate different pulses applied to memory cells, according to an example embodiment.
Figure 8B:
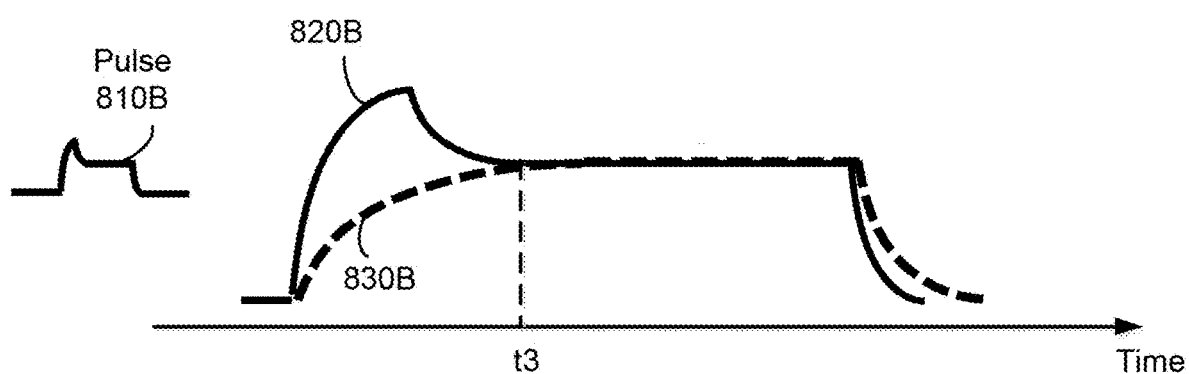
Figure 8C:
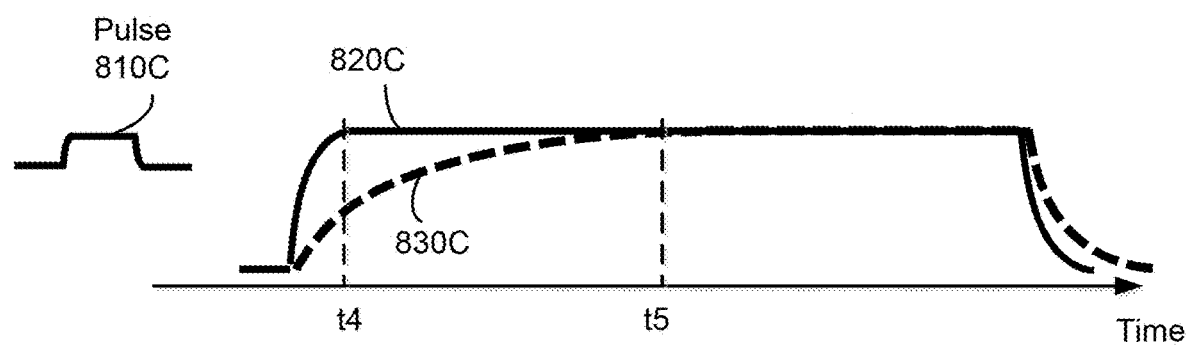

FIGS. 8A through 8C illustrate different pulses applied to memory cells during verification phase, according to an example embodiment. The verification circuit 150 may adjust the verification pulse 810A, 810B, 810C as shown in FIGS. 8A through 8C. In FIG. 8A, the verification circuit 150 outputs the verification pulse 810A with a large overdrive that renders a pulse 820A with a large overdrive propagated to a subset of memory cells 410A and critically damped pulse 830A propagated to a subset of the memory cells 410H. The pulse 830A is damped, due to R-C loading of the word line 162. In this case, the pulse 830A settles at t1, and the pulse 820A settles at t2 after t1. In FIG. 8B, the verification circuit 150 reduces the overdrive in the verification pulse 810B, such that the pulse 820B propagated to the subset of the memory cells 410A is slightly underdamped and the pulse 830B propagated to the subset of the memory cells 410H is slightly overdamped. In this case, the pulses 830A, 830B both settle at t3. In FIG. 8C, the verification circuit 150 further reduces the overdrive in the verification pulse 810C, such that the pulse 820C propagated to the subset of the memory cells 410A is critically damped and the pulse 830C propagated to the subset of the memory cells 410H is overdamped. In this case, the pulse 820C settles at t4 and the pulse 830C settles at t5 after t4.

When the verification operation is performed only on the subset of the memory cells 410H, the verification circuit 150 may apply the verification pulse 810A to the word line 162 with a large overdrive, and the sensing circuit 182 may perform verification operation on the subset of the memory cells 410H by sensing threshold voltages of the subset of the memory cells 410H when the pulse 830A settles at t1. Because the verification operation may not be performed on other memory cells 410A, 410B . . . 410G, the verification circuit 150 does not have to wait until the pulse 820A settles at t2. If the verification circuit 150 applies the verification pulse 810B, then the sensing circuit 182 may perform the verification operation after the pulse 830B settles at t3. If the verification circuit 150 applies the verification pulse 810C, then the sensing circuit 182 may perform the verification operation after the pulse 830C settles at t5. As shown in FIGS. 8A through 8C, overdrive in the pulse 820A causes t1 to be faster than t3 and t5. Thus, by applying the pulse 810A as shown in FIG. 8A, the speed of verification operation can be improved compared to applying the pulses 810B or 810C.

Referring to FIG. 9A, illustrated is a power consumption 910A of storing data at memory cells, when programming operation is performed on entire memory cells. The memory cells are programmed through multiple phases. In one approach, the memory cells are programmed through a pre-charge phase 920, a program phase 925, and a verification phase 935. During the pre-charge phase 920, the memory cells may be preset to particular voltage. The memory cells are programmed with corresponding threshold voltages during the program phase 925. The programmed status is verified during the verification phase 935 to confirm whether threshold voltages programmed are within predetermined ranges. As shown in FIG. 9A, a large amount of current is consumed, when verification operation is performed on entire memory cells.

Referring to FIG. 9B, illustrated is a power consumption 910B of storing data at the memory cells, when programming operation is performed on a subset of the memory cells. By performing verification operation on only a subset of the memory cells, the power consumption 910B can be lowered compared to the power consumption 910A when the verification is performed on the entire memory cells.

Figure 10:
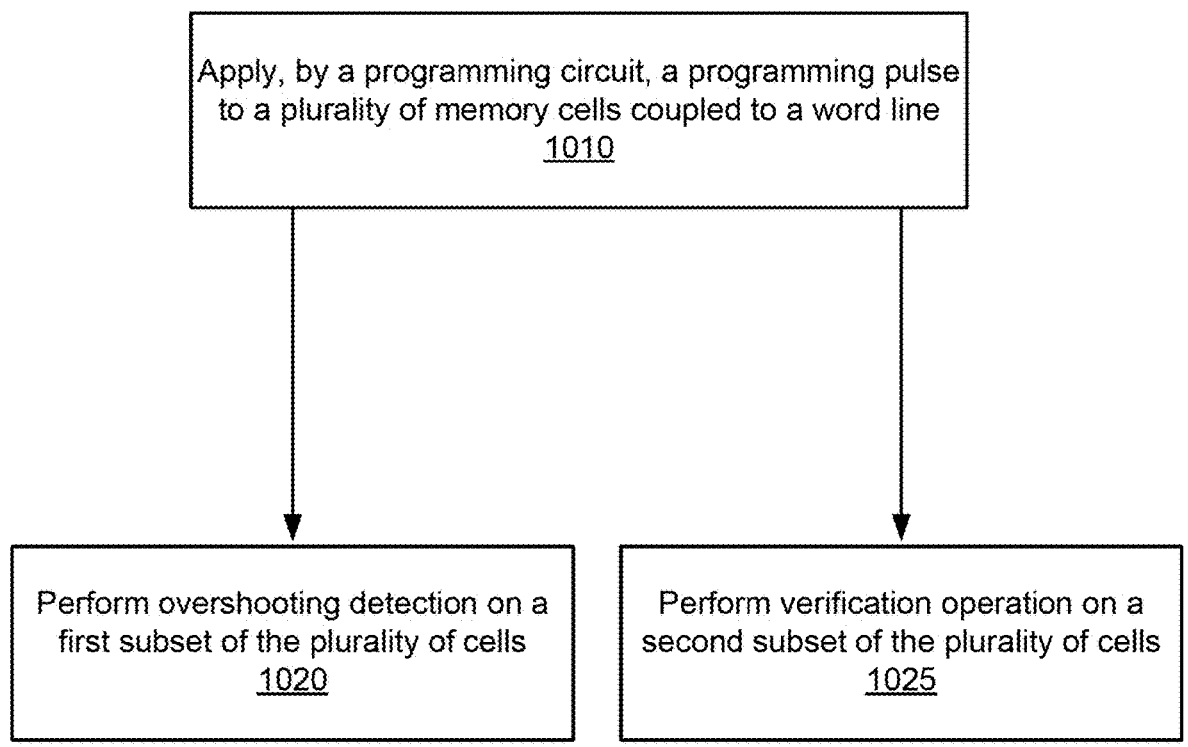
FIG. 10 is a flow chart illustrating a process of performing overshooting detection and verifying programmed status of memory cells by applying a single pulse to the memory cells, according to an example embodiment.

FIG. 10 depicts a flow chart illustrating a process 1000 of performing overshooting detection and verifying programmed status of memory cells by applying a single pulse to the memory cells, according to an example embodiment. The process 1000 may be performed by the controller 106 of FIG. 1. In other embodiments, the process 1000 may be performed by other entities. In other embodiments, the process 1000 includes more, fewer, or different operations than shown in FIG. 10.

In an operation 1010, the programming circuit 140 applies a programming pulse to a plurality of memory cells coupled to a word line 162 in operation 1010.

The overshooting detection circuit 190 performs an overshooting detection on a first subset of the plurality of memory cells 410A in operation 1020. The verification circuit 150 performs a verification operation on a second subset of the plurality of memory cells 410H in operation 1030. In one approach, the verification circuit 150 and the overshooting detection circuit 190 simultaneously perform the overshooting detection and the verification operation in response to the programming pulse applied to the plurality of memory cells. In another approach, the overshooting detection circuit 190 and the verification circuit 150 sequentially performs the overshooting detection and the verification operation. Overshooting detection may be performed before the verification operation or verification operation may be performed before the overshooting detection.

The verification circuit 150 may select the subset of memory cells 410A to perform the overshooting detection and the subset of memory cells 410H to perform the verification operation based on a location of the subsets of memory cells 410A, 410H with respect to the programming circuit 140. For example, the subset of memory cells 410A is more likely to be influenced by an overshooting, because less R-C loading is applied to the subset of memory cells 410A due to a close distance between the programming circuit 140 and the subset of memory cells 410A. Similarly, the subset of memory cells 410H is least likely responsive to the single programming pulse, because more R-C loading is applied to the subset of memory cells 410H due to a long distance between the programming circuit 140 and the subset of memory cells 410H.

By performing overshooting detection and verification operation on subsets of memory cells coupled to a word line 162 rather than entire memory cells, verification process can be performed faster.

Figure 11A:
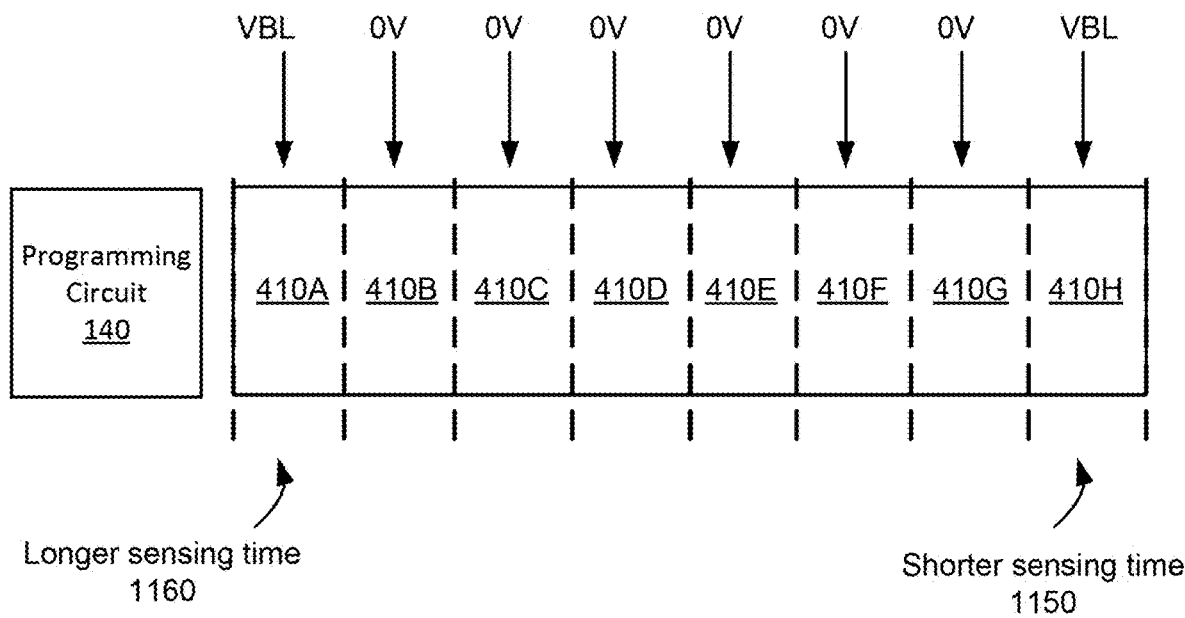
FIG. 11A illustrates example voltages applied to bit lines of memory cells, according to an example embodiment.

FIG. 11A illustrates example voltages applied to bit lines 166 of memory cells, according to an example embodiment. In this example, the overshooting detection is performed on a subset of memory cells 410A and verification operation is performed on a subset of memory cells 410H, in response to a single programming pulse applied to the subsets of memory cells 410A, 410B . . . 410H. The overshooting detection and the verification operation may be performed simultaneously.

In one approach, the verification circuit 150 applies a first voltage (e.g., VBL) to bit lines 166 of the subset of memory cells 410H to perform verification operation. The first voltage (e.g., VBL) allows the subset of memory cells 410H to conduct according to programmed threshold voltages. The verification circuit 150 applies the first voltage to bit lines 166 of the subset of memory cells 410A. The verification circuit 150 may also apply a ground voltage (e.g., '0' voltage) to bit lines 166 of subsets of memory cells 410B, 410C . . . 410G, to prevent the subsets of memory cells 410B, 410C . . . 410G from conducting.

In one aspect, the subset of memory cells 410A is programmed with higher threshold voltages than the subset of memory cells 410H, due to inherent R-C delay. Thus, when same voltage is applied to the bit lines 166 of the subsets of the memory cells 410A, 410H, sensing threshold voltages of the subset of memory cells 410A may be performed for a longer sensing time period 1160 than a shorter sensing time period 1150 for sensing threshold voltages of the subset of memory cells 410H.

Figure 11B:
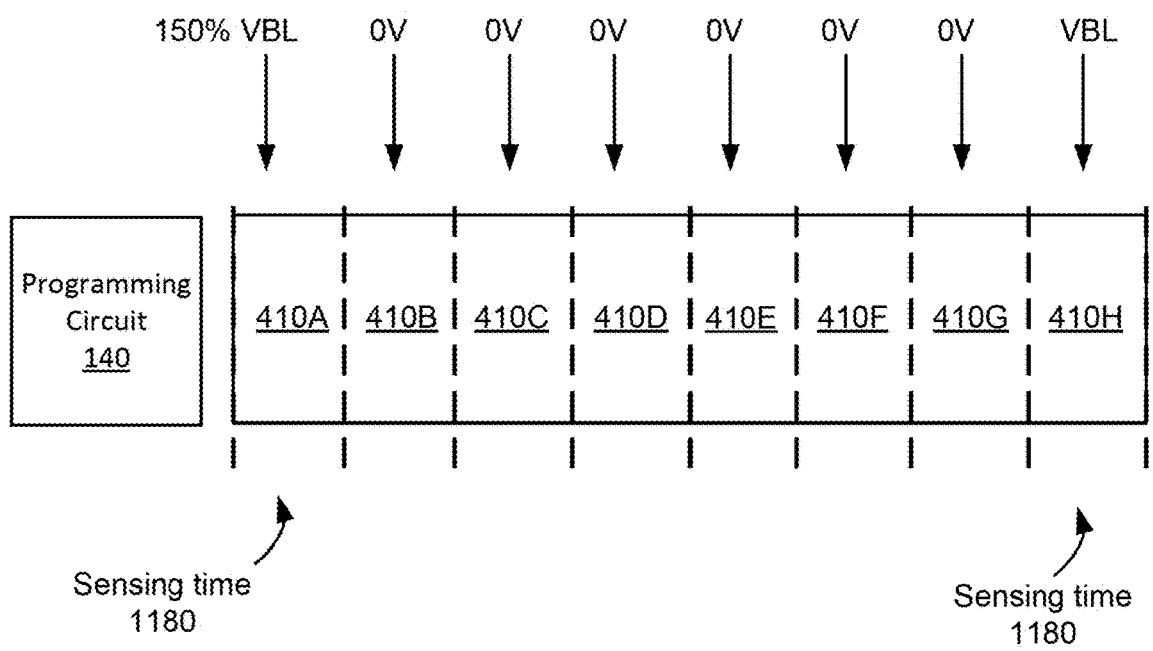
FIG. 11B illustrates example voltages applied to bit lines of memory cells, according to an example embodiment.

FIG. 11B illustrates example voltages applied to bit lines 166 of memory cells, according to an example embodiment. In this embodiment, a second voltage (e.g., 150% VBL) higher than the first voltage (e.g., VBL) is applied to the first subset of the memory cells 410A. By applying the second voltage (e.g., 150% VBL) higher than the first voltage (e.g., VBL) to the subset of memory cells 410A, verifying threshold voltages of the subset of memory cells 410A can be simultaneously performed for a same sensing time period 1180.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:
1. An apparatus comprising:
  memory cells coupled to a word line; and
  a controller coupled to the word line, the controller configured to:
    program the memory cells coupled to the word line, and
    verify a programmed status of a first subset of the memory cells coupled to the word line, wherein the programmed status of the first subset of the memory cells coupled to the word line is indicative of a programmed status of a remainder of the memory cells coupled to the word line.

2. The apparatus of claim 1, wherein the controller includes:
a programming circuit coupled to the word line, the programming circuit configured to apply a programming pulse to the memory cells through the word line to program the memory cells, and
a verification circuit coupled to the first subset of the memory cells, the verification circuit configured to verify the programmed status of the remainder of the memory cells based on the programmed status of the first subset of the memory cells without directly sensing the programmed status of the remainder of the memory cells.

3. The apparatus of claim 2, wherein the verification circuit is not coupled to the remainder of the memory cells coupled to the word line.

4. The apparatus of claim 2,
wherein the programming pulse causes a change in characteristic for each of the memory cells, and
wherein the verification circuit is configured to directly determine whether programmed characteristics of the first subset of the memory cells coupled to the word line satisfy a target characteristic, but not to directly sense whether programmed characteristics of a second subset of the memory cells coupled to the word line satisfy the target characteristic.

5. The apparatus of claim 1, wherein the first subset of the memory cells coupled to the word line includes a single cell and the second subset of the memory cells coupled to the word line includes two or more cells.

6. The apparatus of claim 1, wherein the first subset of the memory cells coupled to the word line includes one eighth of the memory cells coupled to the word line.

7. A device comprising:
a first plurality of memory cells coupled to a word line;
a second plurality of memory cells coupled to the word line;
a programming circuit coupled to the word line, the programming circuit configured to apply a programming pulse to the first plurality of memory cells and the second plurality of memory cells through the word line; and
a sensing circuit coupled to the first plurality of memory cells, the sensing circuit configured to sense a characteristic of the first plurality of memory cells but not the second plurality of memory cells, the sensed characteristic of the first plurality of memory cells indicative of a status of the second plurality of memory cells.

8. The device of claim 7, wherein the first plurality of memory cells are positioned physically farther away from the programming circuit than the second plurality of memory cells.

9. The device of claim 7,
wherein the programming circuit is configured to apply the programming pulse to program the first plurality of memory cells and the second plurality of memory cells with corresponding threshold voltages according to the programming pulse.

10. The device of claim 9, wherein the sensing circuit comprises:
a threshold voltage detection circuit coupled to the first plurality of memory cells, the threshold voltage detection circuit configured to check threshold voltages of the first plurality of memory cells coupled to the word line, but not check threshold voltages of the second plurality of memory cells coupled to the word line.

11. The device of claim 10, further comprising:
a status determination circuit coupled to the threshold voltage detection circuit, the status determination circuit configured to determine a programmed status of the first plurality of memory cells coupled to the word line and a programmed status of the second plurality of memory cells coupled to the word line based on the sensed threshold voltages of the first plurality of memory cells.

12. The device of claim 11, further comprising:
a counting circuit coupled to the threshold voltage detection circuit, the counting circuit configured to determine a number of memory cells of the first plurality of memory cells coupled to the word line having threshold voltages less than a target threshold voltage.

13. The device of claim 12, wherein the programming circuit includes:
a voltage control circuit coupled to the status determination circuit, the voltage control circuit configured to increase a voltage of a subsequent programming pulse to program the memory cells coupled to the word line in response to determining that the memory cells coupled to the word line are incorrectly programmed.

14. The device of claim 11, further comprising a bit line control circuit coupled to bit lines of the first plurality of memory cells coupled to the word line and coupled to bit lines of the second plurality of memory cells coupled to the word line, the bit line control circuit configured to:
apply a bit line voltage to the bit lines of the first plurality of memory cells, while the sensing circuit senses the threshold voltages of the first plurality of memory cells; and
apply a ground voltage to the bit lines of the second plurality of memory cells, while the sensing circuit senses the threshold voltages of the first plurality of memory cells.

15. The device of claim 11, further comprising:
a third plurality of memory cells coupled to the word line, the third plurality of memory cells coupled to the word line closer to the programming circuit than the first plurality of memory cells coupled to the word line and the second plurality of memory cells coupled to the word line.

16. The device of claim 15, further comprising:
a third plurality of memory cells coupled to the word line, wherein the sensing circuit is coupled to the third plurality of memory cells, the sensing circuit configured to sense threshold voltages of the third plurality of memory cells, the device further comprising:
an overshooting detection circuit coupled to the threshold voltage detection circuit, the overshooting detection circuit configured to detect an overshooting of the programming pulse based on the threshold voltages of the third plurality of memory cells coupled to the word line, but not based on the threshold voltages of the first plurality of memory cells coupled to the word line and the threshold voltages of the second plurality of memory cells coupled to the word line.

17. The device of claim 16, wherein the programming circuit includes:
a voltage control circuit coupled to the overshooting detection circuit, the voltage control circuit configured to decrease a voltage of a subsequent programming pulse to program the memory cells coupled to the word line in response to detecting the overshooting of the programming pulse over a target level.

18. The device of claim 16, wherein the status determination circuit and the overshooting detection circuit are configured to simultaneously determine the programmed status of the first plurality of memory cells coupled to the word line and the overshooting of the programming pulse.

19. The device of claim 18, further comprising a bit line control circuit coupled to:
bit lines of the first plurality of memory cells coupled to the word line;
bit lines of the second plurality of memory cells coupled to the word line; and
bit lines of the third plurality of memory cells coupled to the word line, the bit line control circuit configured to:
apply a first voltage to the bit lines of the first plurality of memory cells coupled to the word line;
apply a second voltage to the bit lines of the second plurality of memory cells coupled to the word line; and
apply a third voltage to the bit lines of the third plurality of memory cells coupled to the word line.

20. The device of claim 19, wherein the third voltage is higher than the first voltage and the second voltage, wherein the sensing circuit is configured to:
sense the threshold voltages of the first plurality of memory cells coupled to the word line during a time period, in response to the first voltage applied to the bit lines of the first plurality of memory cells coupled to the word line; and
sense the threshold voltages of the third plurality of memory cells coupled to the word line during the time period, in response to the third voltage applied to the bit lines of the third plurality of memory cells coupled to the word line.

21. The device of claim 19, wherein the third voltage is substantially equal to the first voltage, wherein the sensing circuit is configured to:
sense the threshold voltages of the first plurality of memory cells coupled to the word line during a first time period, in response to the first voltage applied to the bit lines of the first plurality of memory cells coupled to the word line; and
sense the threshold voltages of the third plurality of memory cells coupled to the word line during a second time period longer than the first time period, in response to the third voltage applied to the bit lines of the third plurality of memory cells coupled to the word line, the second time period longer than the first time period.

22. A method comprising:
programming memory cells coupled to a word line;
selecting a first subset of the memory cells based on a physical location of the first subset of the memory cells; and
verifying a programming status of the first subset of the memory cells to indirectly verify a programming status of a second subset of the memory cells without directly verifying the programming status of the second subset of the memory cells.

23. The method of claim 22, further comprising:
applying, by a programming circuit, a programming pulse to program the first subset of the memory cells and the second subset of the memory cells with a corresponding threshold voltage according to the programming pulse, wherein the first subset of the memory cells is farther away from the programming circuit than the second subset of the memory cells.

24. An apparatus comprising:
means for programming memory cells coupled to a word line; and
means for selecting a first subset of the memory cells based on a physical location of the first subset of the memory cells; and
means for verifying a programmed status of the first subset of the memory cells to indirectly verify a programmed status of a second subset of the memory cells without directly verifying the programmed status of the second subset of the memory cells.

* * * * *